US 6,721,666 B2

(12) United States Patent
Warkentin

(10) Patent No.: US 6,721,666 B2
(45) Date of Patent: Apr. 13, 2004

(54) AUTOMATIC METER READER

(76) Inventor: Reginald P. Warkentin, 31 Norris Cls., Red Deer, Alberta (CA), T4P 1R2

( * ) Notice: Subject to any disclaimer, the term of this patent is extended or adjusted under 35 U.S.C. 154(b) by 0 days.

(21) Appl. No.: 09/938,479

(22) Filed: Aug. 23, 2001

(65) Prior Publication Data
US 2002/0062196 A1 May 23, 2002

Related U.S. Application Data

(63) Continuation of application No. 09/046,393, filed on Mar. 23, 1998, now abandoned.

(30) Foreign Application Priority Data

Mar. 5, 1999 (CA) .............................................. 2265122

(51) Int. Cl.$^7$ ........................... B01B 3/00; G06F 19/00; G06F 7/100
(52) U.S. Cl. ........................................... 702/33; 702/45
(58) Field of Search .............................. 702/14–16, 33, 702/42, 45, 47, 50, 150, 151, 152; 324/99 R, 99 D; 178/18.03, 18.07, 20.01, 20.03

(56) References Cited

U.S. PATENT DOCUMENTS

| 3,647,963 A | 3/1972 | Bailey |
| 3,904,822 A | 9/1975 | Kamm et al. |
| 4,029,899 A | 6/1977 | Gordon |
| 4,088,842 A | 5/1978 | Ikedo |
| 4,210,775 A | * 7/1980 | Rodgers et al. .......... 178/20.02 |
| 4,414,634 A | * 11/1983 | Louis et al. ................... 702/45 |
| 4,794,209 A | 12/1988 | Asada et al. |
| 4,837,708 A | * 6/1989 | Wright ........................ 702/49 |
| 5,028,745 A | 7/1991 | Yamanami et al. |
| 5,428,192 A | 6/1995 | Chen et al. |
| 5,629,499 A | * 5/1997 | Flickinger et al. ....... 178/18.01 |

OTHER PUBLICATIONS

DRI–FLO II Repair Parts.
ITT Barton Technical Manual, Models 202A & 208A Differential Pressure Recorder.
HIPAD PLUS 9000 Series Digitizer Operation Manual.
Wacom UD–Series Graphics Tablets UD–1212R, UD–1218R/RE, and UD–1825R User's Manual.

* cited by examiner

Primary Examiner—Marc S. Hoff
Assistant Examiner—Manuel Barbee
(74) Attorney, Agent, or Firm—Christensen O'Connor Johnson Kindness PLLC

(57) ABSTRACT

This invention operates is an adaptation to chart recorders and indicating instruments as a means to detect and store the pen or indicator positions. The method used to capture the information utilizes a sensing element mounted in, on or under the surface on which the pens record or indicators indicate. The pens are equipped to act as pointing devices detectable by the position sensing element. The pen positions are sensed and converted to a format which can be processed and interfaced to other devices.

10 Claims, 4 Drawing Sheets

AUTOMATIC METER READER

CROSS-REFERENCE TO RELATED APPLICATION

This application is a continuation of prior application Ser. No. 09/046,393, filed Mar. 23, 1998 now abandoned, priority from the filing date of which is hereby claimed under 35 U.S.C. § 120.

FIELD OF THE INVENTION

This invention relates to automatic meter readers, particularly automated chart recorders.

BACKGROUND OF THE INVENTION

Chart recorders sense physical parameters, such as fluid flow, volumes, pressure and temperature, and are often used in oil and gas producing, processing, and transportation facilities. These chart recorders consist of sensing elements mechanically linked to actuate pens that mark on a chart. The chart rotates or is otherwise advanced by a chart drive. The pens travel across the chart, marking the variables on the advancing chart paper.

Past attempts to capture the sensed variables at the chart recorders have included linkage driven linear or rotational displacement elements as for example the proposal found in U.S. Pat. No. 4,414,634 issued Nov. 8, 1983. This method requires moving parts such as linkage connections that are subject to wear. These devices require unique calibrations from those normally performed on the chart recorder.

Other attempts have included the use of a camera and supporting hardware mounted in front of the chart to record and disseminate the chart values as disclosed in U.S. Pat. No. 4,837,708 issued Jun. 6, 1989. Size, complexity, cost, potential for tampering or theft and reliability would have hampered the adoption of this method.

A chart digitizing system pioneered by the patent applicant has been developed using existing pen position determining art, and proprietary software to enable the manual tracing of the chart lines once the chart has been created, taken off and placed on the digitizing tablet.

SUMMARY OF THE INVENTION

Conventional chart recorders suffer disadvantages in that there is an inherent delay in the getting the information from the chart and into the system. The chart typically has to be completed, taken off, interpreted before getting the results. The delay presents challenges and difficulties in optimizing operations needing the data.

The invention differs substantially in that the invention allows the pen positions to be detecteted and logged at the recording or indicating instrument in real time.

There is therefore provided in accordance with an aspect of the invention an automatic meter reader, comprising a meter having a movable arm, the movable arm having an indicator tip, the indicator tip being movable through a range of positions in response to the meter sensing a physical parameter, and a digitizer mounted on the meter, the digitizer having a digitizing grid positioned adjacent the indicator tip for sensing the position of the indicator tip.

The use of the invention allows the chart recorder pen positions to be detected and processed as the chart is being created. The digital data can be stored to memory and communicated to other devices. The information is then readily available for use through a variety of common interfaces.

Equipping the marking devices so their position can be detected at the point of contact on the chart or chart backing surface allows a direct correlation between the chart recorded data and the logged values without special calibration efforts on the recorder.

This system has the advantage of operating as a dual system where the ink on paper chart can be retained as the pen functions are logged.

The system has the further advantage that the position sensing grid and electronics has no moving parts to wear. The system will be accurate, reliable, be easy to produce and install.

These and other aspects of the invention are described in the detailed description of the invention and claimed in the claims that follow.

BRIEF DESCRIPTION OF THE DRAWINGS

There will now be described preferred embodiments of the invention, with reference to the drawings, by way of illustration only and not with the intention of limiting the scope of the invention, in which like numerals denote like elements and in which.

DETAILED DESCRIPTION OF PREFERRED EMBODIMENTS

Figure 1:
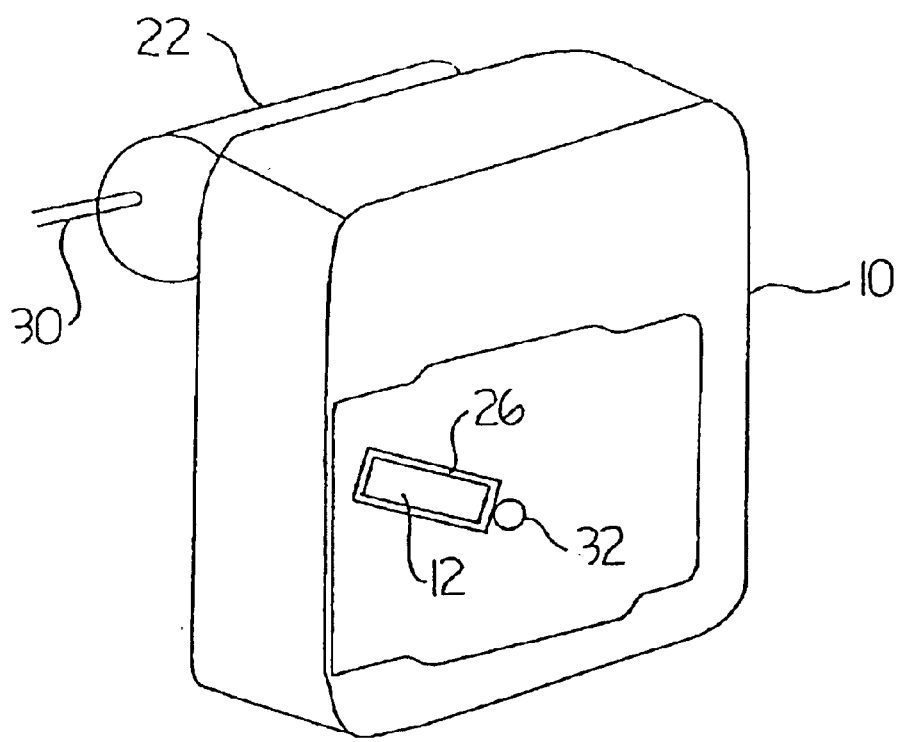
FIG. 1 is a perspective view of a chart recorder and digitizer according to an embodiment of the invention.

FIG. 1 shows an automatic meter reader which has two main parts, a conventional chart recorder 10 that has been modified to incorporate a digitizer 12 and chart pen adaptor 18. The chart recorder 10 may for example be a DRI-FLO II (tm) chart recorder, or an ITT Barton Model 202A or 208A differential pressure recorder, but this invention is not restricted to the particular chart recorder, and may be used on a variety of chart recorders and other meters that have a movable arm.

Figure 5:
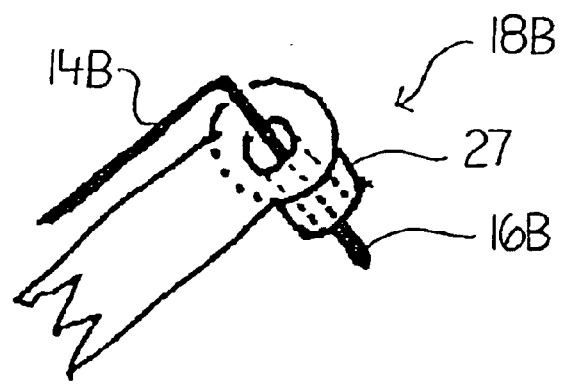
FIG. 5 is a detail of a pen adaptor according to an embodiment of the invention.
Figure 2:
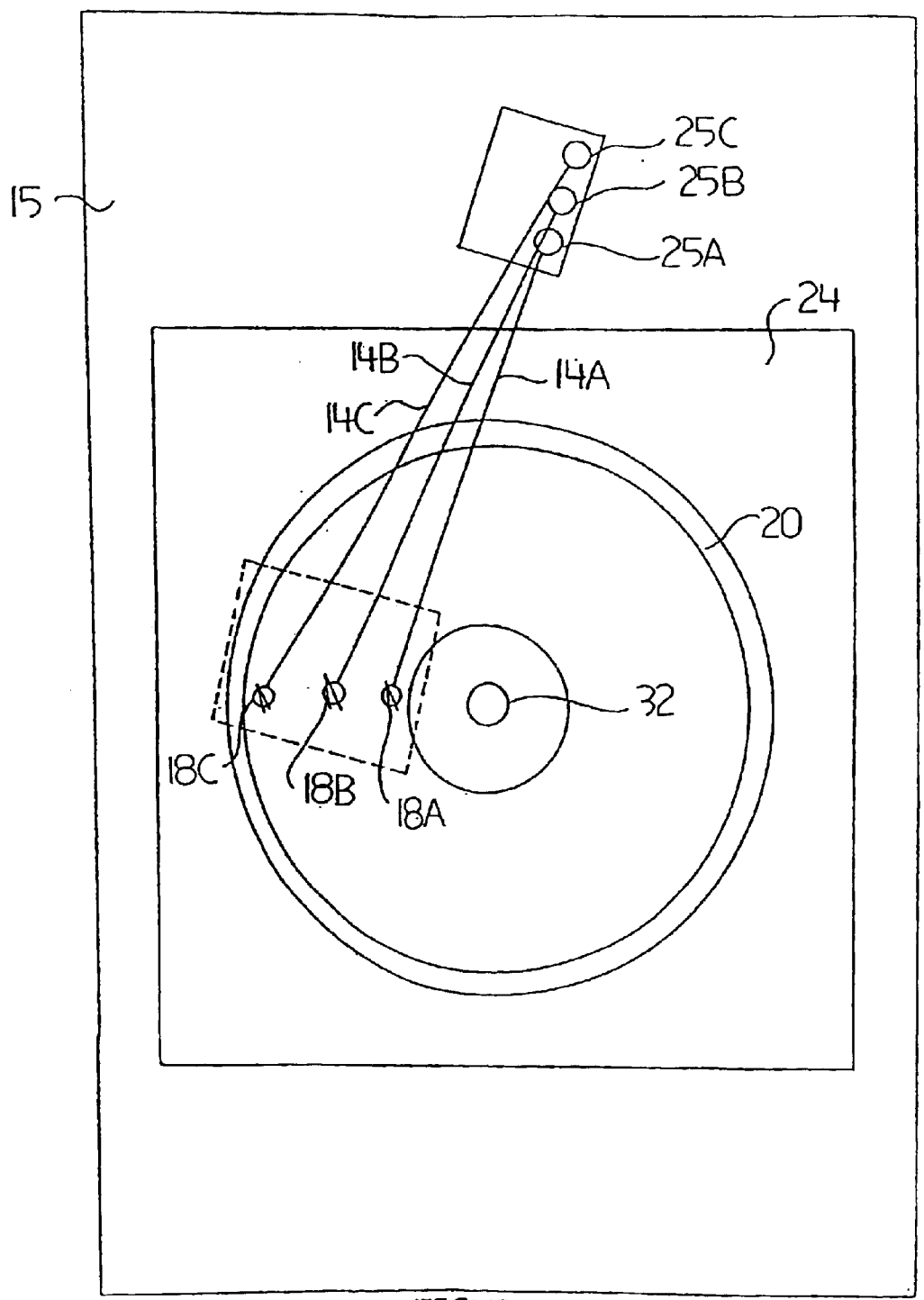
FIG. 2 is a front view of a chart recorder showing location of movable arms according to an embodiment of the invention.
Figure 3:
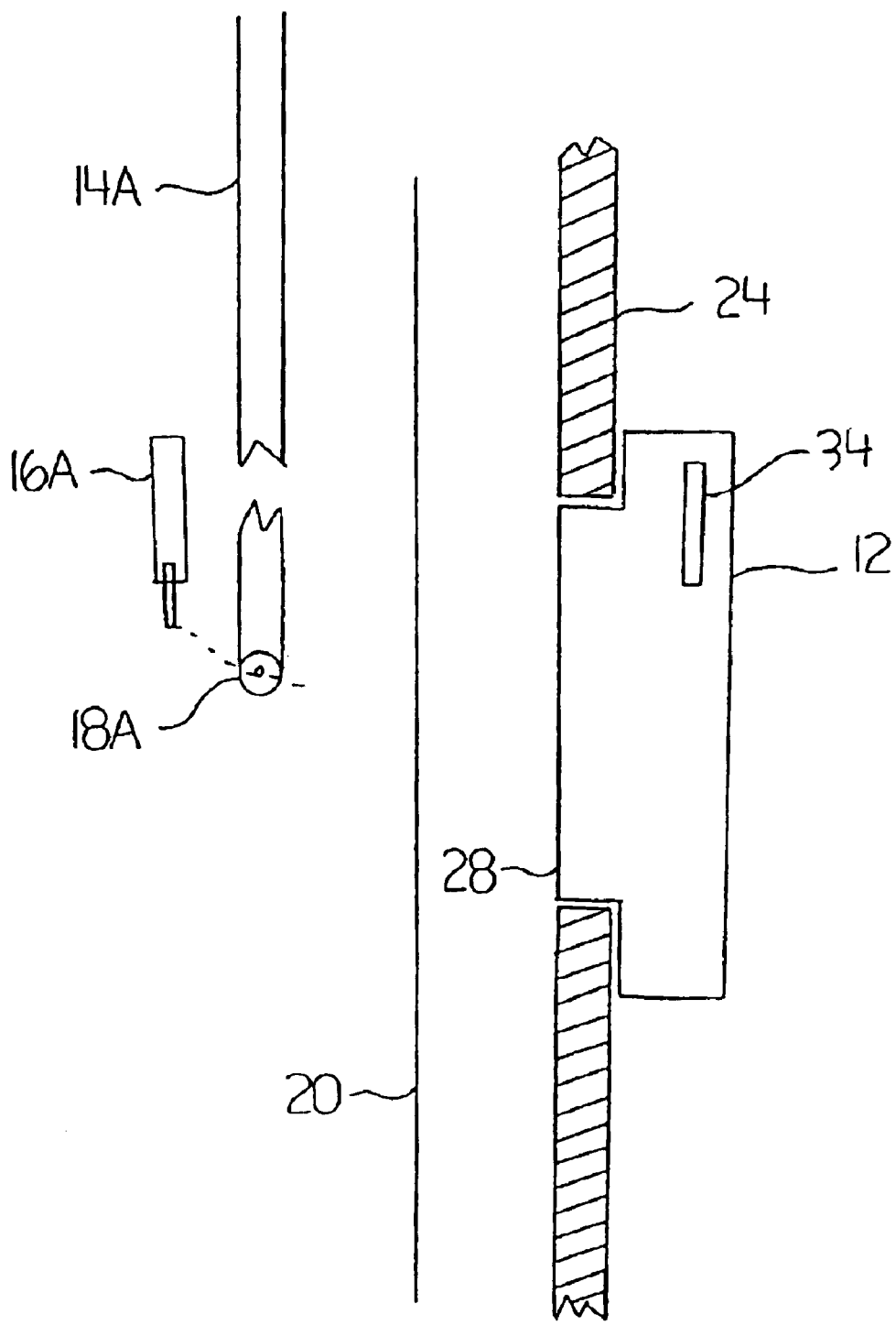
FIG. 3 is a schematic section through the chart recorder and digitizer of FIG. 1 showing the principal components of an embodiment of the invention.
Figure 4A:
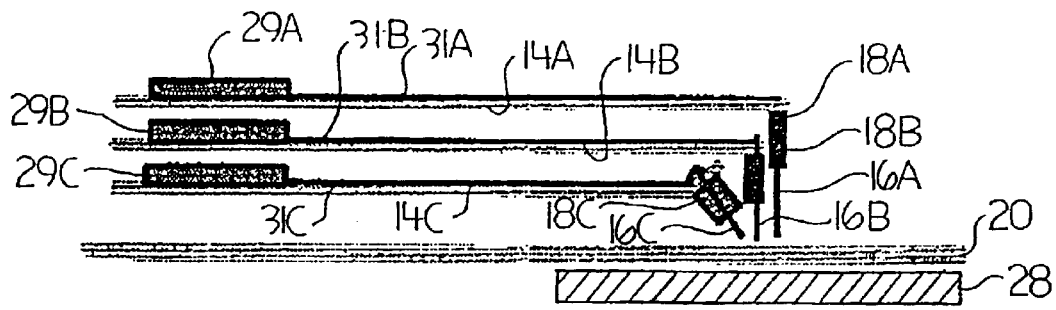
FIG. 4A is a side view of a set of three movable arms with pens according to the invention.
Figure 4B:
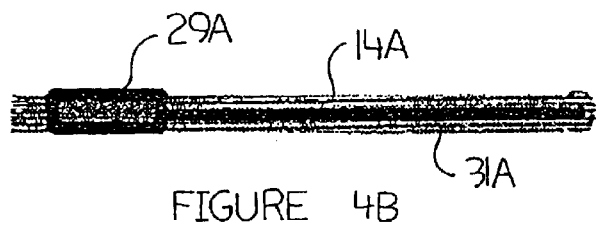
FIG. 4B is a top view of the movable arms of FIG. 4A.
Figure 4C:
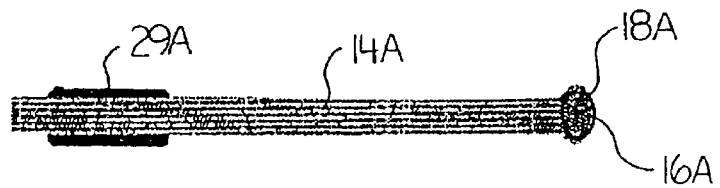
FIG. 4C is a bottom view of the movable arms of FIG. 4A.

As shown in more detail in FIGS. 2 and 4A–4C, the chart recorder 10 has three mechanically actuated movable arms 14A–14C which are mounted on pivot points 25A–25C within a housing 15, in which is installed a backing plate 24. The backing plate 24 is installed in conventional manner. Each movable arm 14A–14C terminates in an indicator tip which includes a pen tip 16A–16C and pen adaptor 18A–18C respectively. Ink reservoirs 29A–29C lying on the movable arms 14A–14C respectively in conventional fashion provide ink through ink capillaries 31A–31C respectively to the pen tips 16A–16C respectively. The chart pen adaptors 18A–18C are located at the end of each movable arm 14A–14C respectively. The chart pen adaptors 18A–18C may be each an electromagnetic coil 27 as illustrated in FIG. 5, having an open core through which the pen tips 16A–16C extend respectively into contact with chart paper 20 during operation. The electromagnetic coils 27 may be glued, crimped or otherwise fastened to the movable arms 14A–14C. The inner movable arm 14C has an angled pen tip 16C, e.g., at 45° to the vertical, to allow it to fit with the other pen tips 16A, 16B.

The chart recorder 10 illustrated senses gas flow through a dry gas flow sensing assembly 22 connected via a line 30 to a well. In response to gas flow (or other parameter being sensed) in a line (or other device) being monitored, the indicator tips 16A–16C move through a range of positions, typically an arc, in response to the meter sensing the physical parameter. The chart 20 rotates about a spindle 32 in the meter 10. Each movable arm 14A–14C follows a different arc across the chart in close proximity to each other.

Digitizer 12 is mounted on the meter 10 by fitting the digitizer 12 into an opening 26 in the backing plate 24 of the meter 10. The digitizer 12 has a digitizing grid 28 positioned adjacent the indicator pen tips 16A–16C for sensing the position of the indicator pen tips 16A–16C. Digitizing grids themselves are well known, and any of various types may be used in the operation of the invention, although the one selected may require modification to fit into a particular meter. In addition, the digitizing pen typically used with a conventional digitizer is replaced by one or more of the chart pen adaptors 18A–18C mounted on the movable arm of the meter 10.

The digitizing grid 28 may be affixed to the chart backing plate 24 in any of various ways, such as by being held by screws. The chart pen adaptors 18A–18C transmit signals to the digitizing grid 28 in known manner. Conventional digitizing electronics and modified conventional programming detects the pen adaptor positions from the meter 10 and converts the pen adaptor positions into an electrical signal representative of the pen position or into a digital format.

A cordless, electromagnetic tablet digitizer incorporating a grid and controller such as the Mutoh America Pen System available from Mutoh America Inc. of Phoenix, Ariz., may be used as the digitizer 12. There are numerous digitizers that may be adapted for mounting on a chart recorder in accordance with this invention, such as the SummaSketch (tm) digitizer available from Summagraphics Corporation of Seymour, Conn., or the UD-Series graphic tablet available from Wacom Technology Corporation of Vancouver, Wash. The conventional digitizer 12 is provided with the pen adaptors 18A–18C to fit the movable arms 14A–14C and modified shape to fit the backing plate 24. The digitizer has built in programming which may be suitably modified to suit the particular application. For example, the PSC5M (tm) or PSC6 (tm) pen system controller products of Mutoh America may be used. As contained in the Mutoh America chart pen, the signal from the pen adaptors 18A–18C may be frequency encoded to contain pen switch information (pen up or down, as well as side switch states). The digitizer 12 may incorporate a conventional RS-232 communications port or conventional removable memory card slot 34. Other data interface devices may be used, including a transceiver for remote reading and interrogation of the digitizer 12. The digitizer 12 acquires data by sensing the position of the pen adaptors 18A–18C on the meter 10.

The digitizer 12 has particular application to circular chart recorders used to determine fluid flow. As shown in FIG. 1, the chart backing plate 24 is replaced or modified to include an opening 26 to contain the digitizing grid 28 which may be etched on to a printed circuit board or screened on a Mylar (tm) grid or other device. In the Mutoh America digitizer, the amplitude and frequency of the received signal on individual sensor grid lines contain the information required to determine pen location, switch status and pen pressure. The system may be retrofitted to existing recorders or enhance newly produced or rebuilt chart recorders with the ability to log the data as it is created. The device can also be applied to indicating instruments and chart recorders of the strip chart or drum variety and digitize the pen positions for any of the variables indicated or recorded. There should be no metal between the pen adaptors 18A–18C and digitizing grid 28 if an electromagnetic coil is used as the pen adaptor 18A–18C. The pen adaptors 18A–18C may be passive or active (powered). If the pen adaptors 18A–18C are powered then the power is supplied in the conventional manner from the digitizer 12 along wires that are themselves conventional but are adapted for this invention by running the wires along the movable arms 14A–14C. In some applications, only a single movable arm 14A, with single pen adaptor 18A and pen tip 16A is required. The invention may be readily adapted to any number of movable arms.

The digitizer 12 is programmed to sense the pen or indicator positions on the meter 10 and process those signals into time stamped, digital data that can be stored and made available to other devices through the interface 34. The meter 10 may also be an instrument that just indicates rather then record (such as pressure gages, speedometers, etc.) In this instance, the indicator tip is a non-marking indicator. The digitizer 12 includes conventional digitizer features such as memory for data storage and power circuitry for low power operation with an external battery pack.

Resolution of the position of the pen may be chosen to suit the application, but may for example be 1016 points per inch, with 0.01 inch accuracy in the vertical position of the pen or 0.02 inch in the 45 degree position.

The digitizer 12, when used with more than one pen indicator, may poll the pen indicator positions one pen at a time, each uniquely identified as separate pens. By reading two pens in a gas recorder, wherein both differential pressure and static pressure were measured, would be enough to allow calculation of the gas flow, provided the temperature was manually input or otherwise entered into downstream gas volume calculation software.

A person skilled in the art could make immaterial modifications to the invention described in this patent document without departing from the essence of the invention that is intended to be covered by the scope of the claims that follow.

The embodiments of the invention in which an exclusive property or privilege is claimed are defined as follows:

1. A chart recorder, comprising:
   a housing;
   a backing plate installed in the housing;
   multiple movable arms, each having an indicating tip, each movable arm being mounted in the housing for movement in an arc adjacent the backing plate in response to sensing of a physical parameter by the chart recorder;
   a digitizer mounted in the housing, the digitizer having a digitizing grid; and
   a respective digitizer detectable element mounted on each movable arm.

2. The chart recorder of claim 1 in which the digitizing grid is mounted in an opening in the backing plate.

3. The chart recorder of claim 1 in which a rotatable chart is mounted on a spindle for rotation of the rotatable chart over the backing plate and the digitizing grid.

4. The chart recorder of claim 1 in which the indicating tip comprises a coil and a pen tip extending through the coil.

5. The chart recorder of claim 4 in which the movable arm extends parallel to the digitizing grid and the indicator tip extends from the movable arm at an angle to the digitizing grid.

6. The chart recorder of claim 5 in which the angle is a right angle.

7. The chart recorder of claim 1 in which the digitizer has a communications port.

8. The chart recorder of claim 1 in which the chart recorder records gas flow.

9. The chart recorder of claim 8 in which the chart recorder is mounted at a well site.

10. The chart recorder of claim 9 in which the chart recorder is remotely readable.

* * * * *